(12) United States Patent
Im et al.

(10) Patent No.: US 12,469,741 B2
(45) Date of Patent: Nov. 11, 2025

(54) APPARATUS FOR PROCESSING SUBSTRATE

(71) Applicant: SEMES CO., LTD., Chungcheongnam-do (KR)

(72) Inventors: Kyung Taek Im, Chungcheongnam-do (KR); Hwi Jae Lee, Chungcheongnam-do (KR); Kyoung Don Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 272 days.

(21) Appl. No.: 18/144,172

(22) Filed: May 6, 2023

(65) Prior Publication Data

US 2024/0105498 A1    Mar. 28, 2024

(30) Foreign Application Priority Data

Sep. 27, 2022 (KR) .......................... 10-2022-0122318

(51) Int. Cl.
*H01L 21/687* (2006.01)
*H01L 21/67* (2006.01)

(52) U.S. Cl.
CPC .. *H01L 21/68785* (2013.01); *H01L 21/67103* (2013.01); *H01L 21/68742* (2013.01)

(58) Field of Classification Search
CPC ................ H01L 21/67109; H01L 21/67103
See application file for complete search history.

(56) References Cited

U.S. PATENT DOCUMENTS

| | | | |
|---|---|---|---|
| 10,763,764 B2 * | 9/2020 | Hiroki | H01L 21/67103 |
| 2003/0159307 A1 * | 8/2003 | Sago | H01L 21/67017 34/107 |
| 2004/0097088 A1 * | 5/2004 | Kitayama | H01L 21/67109 156/345.1 |
| 2004/0244945 A1 * | 12/2004 | Lee | F28F 3/12 165/47 |
| 2007/0081294 A1 * | 4/2007 | Buchberger | H01L 21/6831 361/234 |

(Continued)

FOREIGN PATENT DOCUMENTS

| | | |
|---|---|---|
| JP | 2001-24240 | 1/2001 |
| JP | 2019-201086 | 11/2019 |

(Continued)

OTHER PUBLICATIONS

Office Action dated Jun. 27, 2024 for Korean Patent Application No. 10-2022-0122318 and its English translation from Global Dossier.

*Primary Examiner* — Jason L Vaughan
(74) *Attorney, Agent, or Firm* — WOMBLE BOND DICKINSON (US) LLP

(57) ABSTRACT

An apparatus for processing a substrate includes a support plate including a first accommodation space having a disk shape disposed therein and supporting a substrate; a first cooling means accommodated in the first accommodation space and including a phase change material; and a second cooling means disposed in the support plate and disposed to have at least a portion of the first cooling means interposed between the second cooling means and an upper surface of the support plate, and including cooling liquid flowing in the support plate.

19 Claims, 16 Drawing Sheets

(56) References Cited

U.S. PATENT DOCUMENTS

| | | | |
|---|---|---|---|
| 2008/0289767 A1* | 11/2008 | Tandou | H01L 21/67109 156/345.37 |
| 2016/0378092 A1* | 12/2016 | Yamamoto | G05B 19/404 700/300 |
| 2019/0123405 A1 | 4/2019 | Jeon et al. | |
| 2019/0287827 A1* | 9/2019 | deVilliers | H01L 21/67109 |
| 2019/0355598 A1 | 11/2019 | Kataoka | |

FOREIGN PATENT DOCUMENTS

| | | |
|---|---|---|
| KR | 10-2003-0071498 | 9/2003 |
| KR | 10-2003-0074713 | 9/2003 |
| KR | 10-2004-0104786 | 12/2004 |
| KR | 10-2006-0021694 | 3/2006 |
| KR | 10-2019-0044180 | 4/2019 |
| KR | 10-2021-0054095 | 5/2021 |

\* cited by examiner

APPARATUS FOR PROCESSING SUBSTRATE

CROSS-REFERENCE TO RELATED APPLICATIONS

The application claims benefit of priority to Korean Patent Application No. 10-2022-0122318 filed on Sep. 27, 2022 in the Korean Intellectual Property Office, the disclosure of which is incorporated herein by reference in its entirety.

BACKGROUND

1. Field

Example embodiments of the present disclosure relate to an apparatus for processing a substrate.

2. Description of Related Art

Generally, among processes of manufacturing a semiconductor, a substrate may be cooled in a process such as photo, etching, and packaging processes if desired and subsequent processes may be performed thereafter. For example, in a process of manufacturing a semiconductor, a photo process may include a process of applying photoresist, developing, cleaning, heat treatment, and the like to a substrate in a process chamber. The substrate having gone through the processes may be discharged to the outside of the process chamber in a high temperature state, and the substrate may need to be cooled to a predetermined temperature for subsequent processing.

Generally, as a cooling means for cooling a substrate, a cooling means for cooling using a cooling liquid may be installed in a cooling plate for supporting a substrate. However, a study into implementing rapid cooling for the substrate may be necessary with respect to the cooling means.

SUMMARY

An example embodiment of the present disclosure is to provide an apparatus for processing a substrate which may improve cooling performance for a substrate.

According to an example embodiment of the present disclosure, an apparatus for processing a substrate includes a support plate including a first accommodation space having a disk shape disposed therein and supporting a substrate; a first cooling means accommodated in the first accommodation space and including a phase change material; and a second cooling means disposed in the support plate and disposed to have at least a portion of the first cooling means interposed between the second cooling means and an upper surface of the support plate, and including cooling liquid flowing in the support plate.

The second cooling means may be spaced apart from a lower portion of the first accommodation space in the support plate, and the first cooling means may include a heat transfer member disposed on an internal wall surface of the first accommodation space and in contact with the phase change material.

The heat transfer member may include a first heat transfer member disposed on an upper wall surface of the first accommodation space and a second heat transfer member disposed on a lower wall surface of the first accommodation space.

The first heat transfer member may include a plurality of first heat transfer pins spaced apart from each other with a predetermined distance therebetween on an upper wall surface of the first accommodation space; and the second heat transfer member includes a plurality of second heat transfer pins spaced apart from each other on a lower wall surface of the first accommodation space with a predetermined distance therebetween and alternately disposed with the first heat transfer pins.

The plurality of first heat transfer pins may be spaced apart from each other on an upper wall surface of the first accommodation space in a concentric shape with respect to a center of the first accommodation space, and the plurality of second heat transfer pins may be spaced apart from each other on a lower wall surface of the first accommodation space in a concentric shape with respect to a center of the first accommodation space to be alternately disposed with the plurality of first heat transfer pins.

The plurality of first heat transfer pins may extend in parallel to each other in one direction on an upper wall surface of the first accommodation space, and the plurality of second heat transfer pins may extend in parallel to the plurality of first heat transfer pins on a lower wall surface of the first accommodation space.

The first heat transfer pin and the second heat transfer pin may protrude alternately with each other in a thickness direction of the support plate, and the first heat transfer pin and the second heat transfer pin may have portions overlapping each other in the thickness direction.

A protruding end of the first heat transfer pin and a protruding end of the second heat transfer pin may overlap each other in the thickness direction.

The first accommodation space may have an area entirely covering the second cooling means when viewed from above.

The phase change material may include one of a paraffinic material and a eutectic salt material.

The support plate may include a housing forming the first accommodation space therein.

The second cooling means may include a cooling liquid flow path spaced apart from a lower portion of the first accommodation space in the support plate, and including an inlet port into which the cooling liquid flows and an outlet port through which the cooling liquid flows out to allow the cooling liquid flows therethrough.

The support plate may include a second accommodation space spaced apart from a lower portion of the first accommodation space, and the second cooling means includes a cooling liquid pipe disposed in the second accommodation space and including an inlet port through which the cooling liquid flows in and an outlet port through which the cooling liquid flows out to allow the cooling liquid flows therethrough, and the inlet port and the outlet port may be disposed adjacent to each other.

The second cooling means may include a cooling liquid pipe disposed on a lower surface of the first accommodation space and including an inlet port through which the cooling liquid flows in and an outlet port through which the cooling liquid flows out to allow the cooling liquid flows therethrough, and the phase change material is in contact with an external wall surface of the cooling liquid pipe in the first accommodation space, and the heat transfer member may be disposed on an upper wall surface of the first accommodation space and an external wall surface of the cooling liquid pipe.

According to another example embodiment of the present disclosure, an apparatus for processing a substrate includes a support plate including a first accommodation space having a disk shape disposed therein and supporting a substrate; a support pin disposed in the support plate to be partitioned from the first accommodation space, penetrating an upper surface of the support plate, and supporting the substrate to move up and down; a first cooling means accommodated in the first accommodation space and including a phase change material; and a second cooling means disposed in the support plate and disposed to have the first cooling means interposed between the second cooling means and an upper surface of the support plate, and cooling the support plate.

According to another example embodiment of the present disclosure, an apparatus for processing a substrate includes a process chamber in which the substrate is accommodated; a support plate disposed in the process chamber, including a first accommodation space having a disk shape and a cooling liquid flow path disposed vertically and spaced apart from each other therein, and supporting a substrate; a first cooling means including a phase change material accommodated in the first accommodation space, a plurality of first heat transfer pins in contact with the phase change material and spaced apart from each other and protruding downwardly from an upper wall surface of the first accommodation space, and a plurality of second heat transfer pins spaced apart from each other and protruding upwardly from a lower wall surface of the first accommodation space and disposed alternately with the first heat transfer member; and a second cooling means including cooling liquid accommodated in the cooling liquid flow path and flowing through the cooling liquid flow path.

The first accommodation space may have an area entirely covering the cooling liquid flow path when viewed from above.

The first heat transfer pin and the second heat transfer pin may protrude alternately from each other in a thickness direction of the support plate, and a protruding end of the first heat transfer pin and a protruding end of the second heat transfer pin may overlap each other in the thickness direction The plurality of first heat transfer pins may be spaced apart from each other on an upper wall surface of the first accommodation space in a concentric shape with respect to a center of the first accommodation space, and the plurality of second heat transfer pins may be spaced apart from each other on a lower wall surface of the first accommodation space in a concentric shape with respect to a center of the first accommodation space to be alternately disposed with the first heat transfer pins.

The phase change material may include one of a paraffinic material and a eutectic salt material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
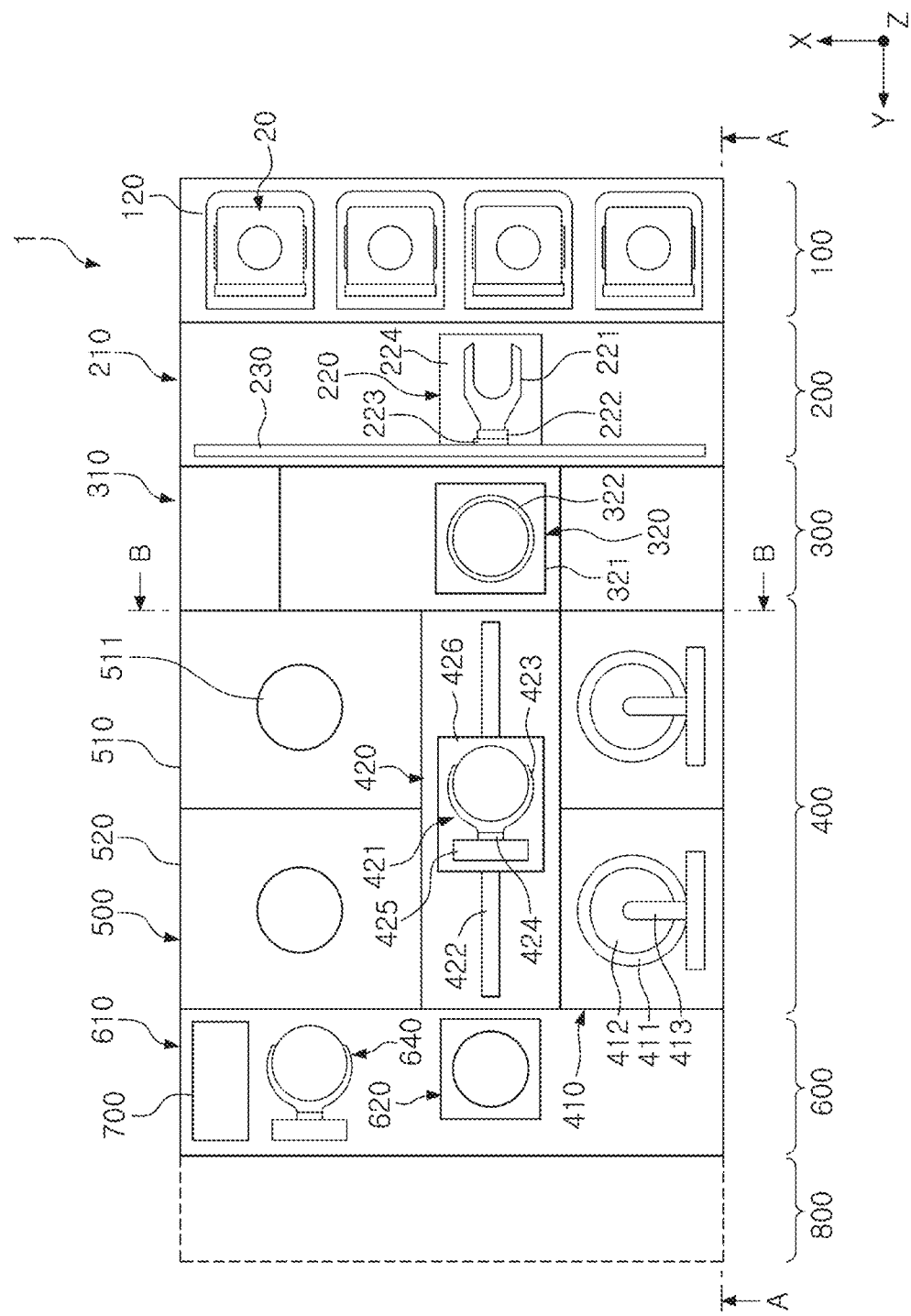
FIG. 1 is a diagram illustrating an apparatus for processing a substrate according to an example embodiment of the present disclosure, viewed from above.

Hereinafter, example embodiments of the present disclosure will be described as below with reference to the attached drawings. The present disclosure may be implemented in different forms and are not limited to the example embodiments described herein.

In the drawings, same elements will be indicated by same reference numerals. Also, redundant descriptions and detailed descriptions of known functions and elements that may unnecessarily make the gist of the present disclosure obscure will not be provided. In the drawings, same elements will be indicated by same reference numerals. The terms such as "upper," "upper portion," "upper side," "upper surface," "upper wall surface," "lower" "lower portion," "lower side," "lower surface," "lower wall surface" refer to the drawings. Also, the terms such as "internal" and "external" are based on a peripheral portion of the component, and may vary depending on the direction in which the element or component may be disposed.

The terms, "include," "comprise," "is configured to," or the like of the description are used to indicate the presence of features, numbers, operations, operations, elements, portions or combination thereof, and do not exclude the possibilities of combination or addition of one or more features, numbers, operations, operations, elements, portions or combination thereof.

Figure 2:
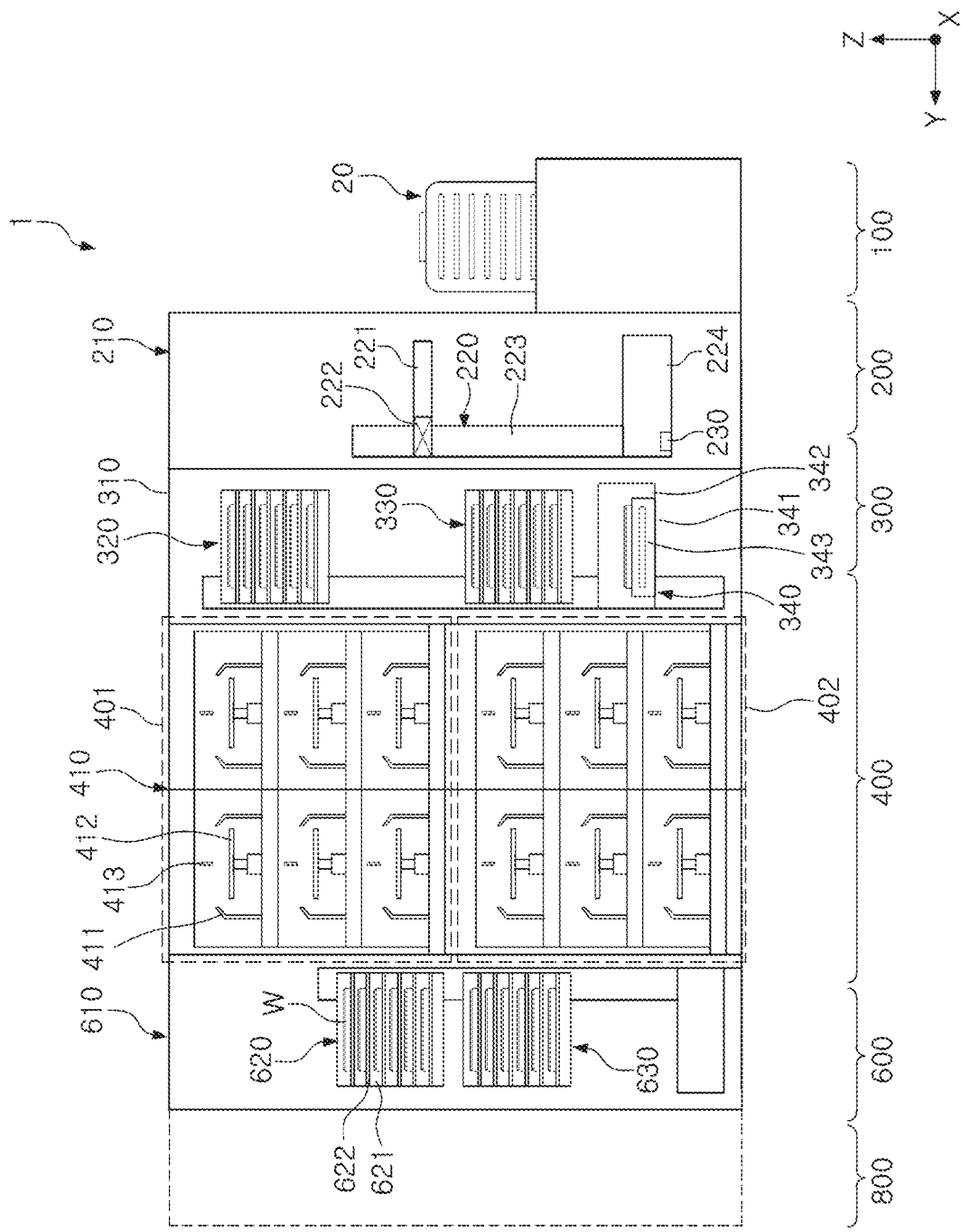
FIG. 2 is a diagram illustrating an apparatus for processing a substrate according to an example embodiment of the present disclosure, viewed in direction A-A'.
Figure 3:
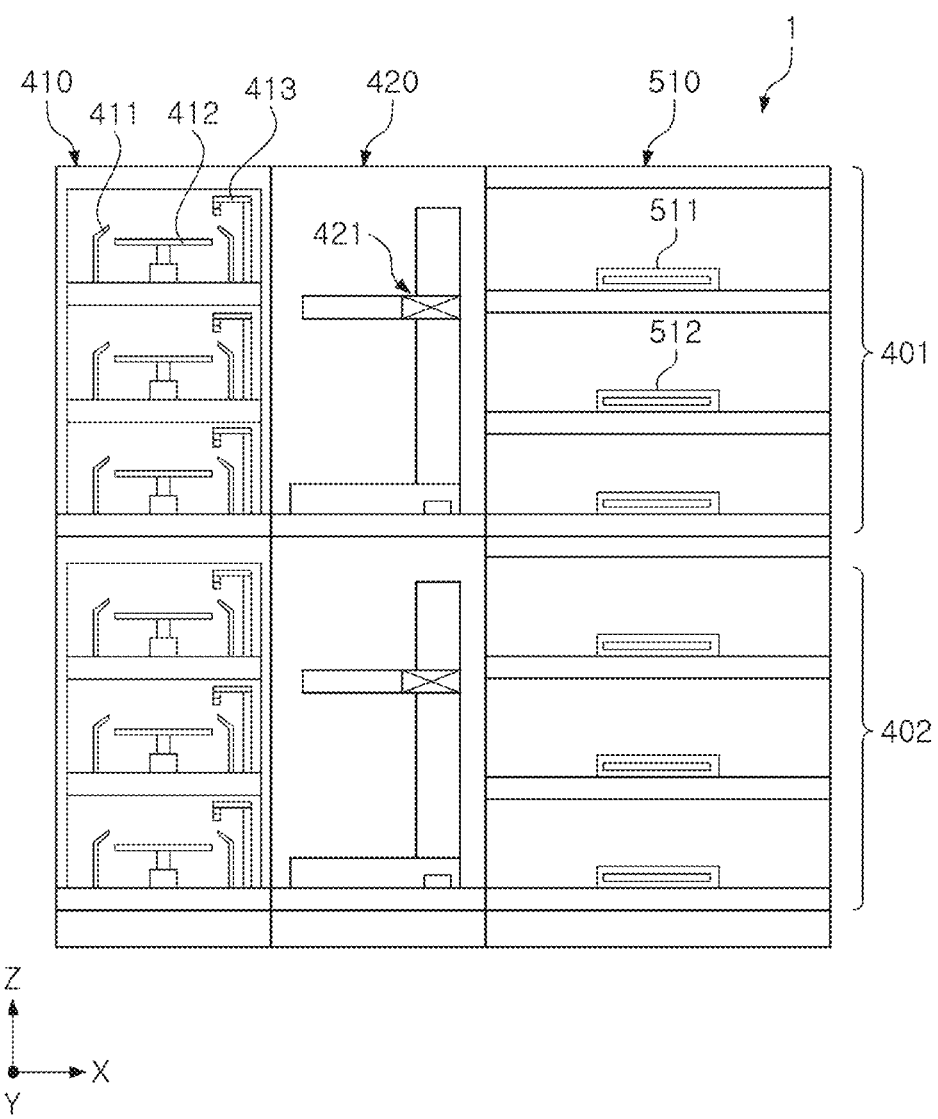
FIG. 3 is a diagram illustrating an apparatus for processing a substrate according to an example embodiment of the present disclosure, viewed in direction B-B'.

FIG. 1 is a diagram illustrating an apparatus for processing a substrate according to an example embodiment, viewed from above. FIG. 2 is a diagram illustrating an apparatus for processing a substrate according to an example embodiment, viewed in direction A-A'. FIG. 3 is a diagram illustrating an apparatus for processing a substrate according to an example embodiment, viewed in direction B-B'.

Referring to FIGS. 1 to 3, the apparatus for processing a substrate 1 may include a load port 100, an index module 200, a buffer module 300, a coating and developing module 400, and a purge module 700. The load port 100, the index module 200, the buffer module 300, the coating and developing module 400 and the interface module 600 may be disposed linearly in one direction. The purge module 700 may be provided in the interface module 600. Alternatively, the purge module 700 may be provided in various positions, such as a position in which the exposure apparatus of the rear end of the interface module 600 is connected or a side unit of the interface module 600.

Hereinafter, the direction in which the load port 100, the index module 200, the buffer module 300, the coating and developing module 400, and the interface module 600 may be disposed may be referred to as the first direction Y, the direction perpendicular to the first direction Y may be referred to as the second direction X when viewed from above, and the direction perpendicular to the first direction Y and the second direction X may be referred to as the third direction Z.

The substrate W may move in a state accommodated in the cassette 20. The cassette 20 may have a structure sealed from the outside. For example, as the cassette 20, a front open unified pod (FOUP) having a front door may be used.

In the description below, the load port 100, the index module 200, the buffer module 300, the coating and developing module 400, the interface module 600 and the purge module 700 will be described in greater detail.

The load port 100 may have a mounting table 120 on which a cassette 20 containing a substrate W may be disposed. A plurality of mounting tables 120 may be provided, and the mounting tables 120 may be disposed linearly in the second direction X. FIG. 2 illustrates an example in which four mounting tables 120 may be provided, but the number of the mounting tables 120 may be varied.

The index module 200 may transfer the substrate W between the cassette 20 disposed on the mounting table 120 of the load port 100 and the buffer module 300. The index module 200 may include a frame 210, an index robot 220, and a guide rail 230. The frame 210 may be generally provided in the shape of a rectangular parallelepiped having a void therein, and may be disposed between the load port 100 and the buffer module 300. The frame 210 of the index module 200 may be provided on a level lower than that of the frame 310 of the buffer module 300. The index robot 220 and the guide rail 230 may be disposed within the frame 210. The index robot 220 may be provided such that the hand 221 directly handling the substrate W may move and rotate in a first direction Y, a second direction X, and a third direction Z. The index robot 220 may include a hand 221, an arm 222, a support stand 223, and a support 224. The hand 221 may be fixed to the arm 222. The arm 222 may be provided to be stretched and rotated. A length direction of the support stand 223 may be disposed in the third direction Z. The arm 222 may be coupled to the support stand 223 so as to move along the support stand 223. The support stand 223 may be fixed and coupled to the support 224. The guide rail 230 may be provided such that a length direction thereof may be disposed in the second direction X. The support 224 may be coupled to the guide rail 230 so as to linearly move along the guide rail 230. Also, although not illustrated, a door opener for opening and closing the door of the cassette 20 may be further provided in the frame 210.

The buffer module 300 may include a frame 310, a first buffer 320, a second buffer 330 and a cooling chamber 340. The frame 310 may be provided in the shape of a rectangular parallelepiped with a void therein, and may be disposed between the index module 200 and the coating and developing module 400. The first buffer 320, the second buffer 330 and the cooling chamber 340 may be disposed within the frame 310. The cooling chamber 340, the second buffer 330, and the first buffer 320 may be disposed in order in the third direction Z upwardly. The first buffer 320 may be disposed on a level corresponding to a level of the coating module 401 of the coating and developing module 400, and the second buffer 330 and the cooling chamber 340 may be provided on a level corresponding to a level of the developing module 402 of the coating and developing module 400.

Each of the first buffer 320 and the second buffer 330 may temporarily store a plurality of substrates W. The first buffer 320 may have a housing 321 and a plurality of support stands 322. In the first buffer 320, the support stands 322 may be disposed within the housing 321 and may be spaced apart from each other in the third direction Z. The second buffer 330 may have a housing 331 and a plurality of support stands 332. In the second buffer 330, the support stands 332 may be disposed within the housing 331 and may be spaced apart from each other in the third direction Z. The substrate W may be disposed on a support stand 322 of the first buffer 320 and a support stand 332 of the second buffer 330. The housing 331 may have an opening in the direction in which the index robot 220 may be provided such that the index robot 220 may carry in or may take out the substrate W from the support stand 332 in the housing 331. The first buffer 320 may have a structure substantially similar to that of the second buffer 330. However, the housing 321 of the first buffer 320 may have an opening in the direction in which the first buffer robot 360 is provided and in the direction in which the coating portion robot 421 disposed on the coating module 401 is provided. The number of support stands 322 provided in the first buffer 320 and the number of support stands 332 provided in the second buffer 330 may be the same or different. According to an example, the number of support stands 332 provided to the second buffer 330 may be greater than the number of support stands 322 provided to the first buffer 320.

The cooling chamber 340 may cool the substrate W. The cooling chamber 340 may include a housing 341 and a cooling plate 342. The cooling plate 342 may have an upper surface on which the substrate W is disposed and the cooling means 343 for cooling the substrate W. As the cooling means 343, various methods such as cooling by cooling water or cooling using a thermoelectric element may be used. Also, a lift pin assembly for positioning the substrate W on the cooling plate 342 may be provided in the cooling chamber 340. The housing 341 may have an opening in the direction in which the index robot 220 is provided and the direction in which the developing portion robot is provided such that the developing portion robot provided in the index robot 220 and developing module 402 may carry in or take out the substrate W to the cooling plate 342. Also, doors for opening and closing the aforementioned opening may be provided in the cooling chamber 340.

In the above description, the buffer module 300 may include components of the cooling chamber 340, but an example embodiment thereof is not limited thereto, and components of the cooling chamber 340 may not be provided if desired.

The coating module 401 may include a process of applying a photoresist such as photoresist to the substrate W and a heat treatment process such as heating and cooling the substrate W before and after a resist application process. The coating module 401 may have a coating chamber 410, a heat treatment chamber unit 500, and a transfer chamber 420. The coating chamber 410, the transfer chamber 420, and the heat treatment chamber unit 500 may be disposed in order in the second direction X. That is, with respect to the transfer chamber 420, the coating chamber 410 may be provided on one side of the transfer chamber 420, and the heat treatment chamber unit 500 may be provided on the other side of the transfer chamber 420.

A plurality of coating chambers 410 may be provided in the third direction Z. Also, as illustrated in FIG. 1, a plurality of coating chambers 410 may be provided in the first direction Y, or a coating chamber 410 may be provided in the first direction Y. The heat treatment chamber unit 500 may include a baking chamber 510 and a cooling chamber 520, and the plurality of baking chambers 510 and the plurality of cooling chambers 520 may be provided in the third direction Z. The transfer chamber 420 may be disposed parallel to the first buffer 320 of the first buffer module 300 in the first direction 12. In the transfer chamber 420, a coating portion robot 421 and a guide rail 422 may be disposed. The transfer chamber 420 may have a substantially rectangular shape. The coating portion robot 421 may transfer the substrate W between the baking chamber 510, the cooling chamber 520, the coating chamber 410, and the first buffer 320 of the first buffer module 300.

The guide rail 422 may be disposed such that a length direction thereof may be parallel to the first direction Y. The guide rail 422 may guide the coating portion robot 421 to linearly move in the first direction Y. The coating portion robot 421 may have a hand 423, an arm 424, a support stand 425, and a support 426. The hand 423 may be fixed to the arm 424. The arm 424 may be configured to be stretched such that the hand 423 may move in the horizontal direction. The support stand 425 may be provided such that a length direction thereof may be disposed in the third direction Z. The arm 424 may be coupled to the support stand 425 so as to linearly move in the third direction Z along the support stand 425. The support stand 425 may be fixed and coupled to the support 426, and the support 426 may be coupled to the guide rail 422 so as to move along the guide rail 422.

The coating chambers 410 may have the same structure, but types of processing liquid used in each coating chamber 410 may be different. As the processing liquid, a processing liquid for forming a photoresist film or an anti-reflective film may be used.

The coating chamber 410 may apply processing liquid on the substrate W. A processing unit including a processing vessel 411, a support portion 412 and a nozzle portion 413 may be provided in the coating chamber 410.

For example, in the coating chamber 410, a processing unit may be disposed in the first direction Y, but an example embodiment thereof is not limited thereto, and two or more processing units may be disposed in the coating chamber 410. The processing units may have the same structure. However, the type of processing liquid used in the processing units may be different.

The processing vessel 411 of the coating chamber 410 may have an open upper portion shape. The support portion 412 may be disposed within the processing vessel 411 and may support the substrate W. The support portion 412 may be provided to rotate. The nozzle portion 413 may supply processing liquid to the substrate W disposed on the support portion 412. The processing liquid may be applied to the substrate W by a spin coat method. Also, in the coating chamber 410, a nozzle (not illustrated) for supplying a cleaning liquid such as deionized water (DIW) to clean the surface of the substrate W coated with processing liquid and a bag rinse nozzle (not illustrated) for cleaning the lower surface of the substrate W may be optionally further provided.

In the baking chamber 510, when the substrate W is seated by the coating portion robot 421, the substrate W may be heat-treated.

In the baking chamber 510, a prebake process of heating the substrate W to a predetermined temperature to remove organic matter or moisture from the surface of the substrate W before applying the processing liquid or processing liquid to the wafer W, or a soft bake process performed after applying the processing liquid on the wafer W may be performed, and a cooling process for cooling the substrate W may be performed after each heating process.

The baking chamber 510 may include a heating plate 511 and a cooling plate 512. The cooling plate 512 may be provided with a cooling means such as cooling water or a thermoelectric element.

In the cooling chamber 520, a cooling process of cooling the substrate W may be performed before coating the processing liquid. A cooling plate may be provided in the cooling chamber 520. The cooling plate may include a cooling means to which various methods such as cooling by cooling water or cooling using a thermoelectric element may be used to cool the substrate W.

The interface module 600 may connect the coating and developing module 400 to the external exposure apparatus 800. The interface module 600 may include an interface frame 610, a first interface buffer 620, a second interface buffer 630 and a transfer robot 640, and the transfer robot 640 may transfer the substrate transferred to the first and second interface buffers 620 and 630 after the coating and developing module 400 is finished to the exposure apparatus 800. The first and second interface buffer 620 may include a housing 621 and a support stand 622, and the transfer robot 640 and the coating portion robot 421 may carry in/out the substrate W to the support stand 622.

The apparatus for processing a substrate having such the components may perform a photo processing process by spraying various types of processing liquid to the substrate. Here, since the substrate processed before or after application of the processing liquid on the substrate is discharged out of the chamber in a high temperature state, the substrate may be cooled to perform the subsequent process. To cool such a substrate, the configurations of the apparatus for processing a substrate according to various embodiments will be described with reference to the drawings.

Embodiment 1

Figure 4:
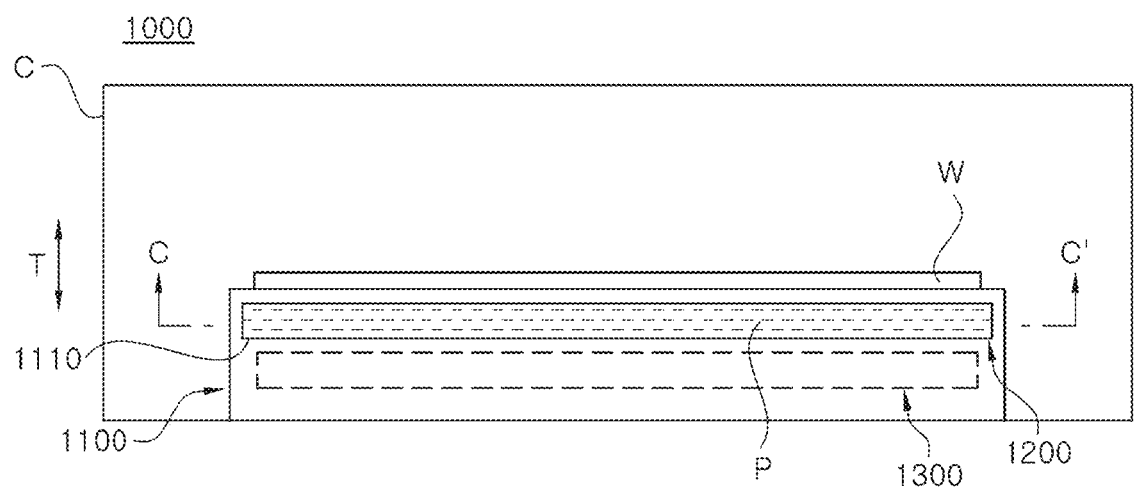
FIG. 4 is a diagram illustrating components of an apparatus for processing a substrate according to embodiment 1 of the present disclosure.
Figure 5:
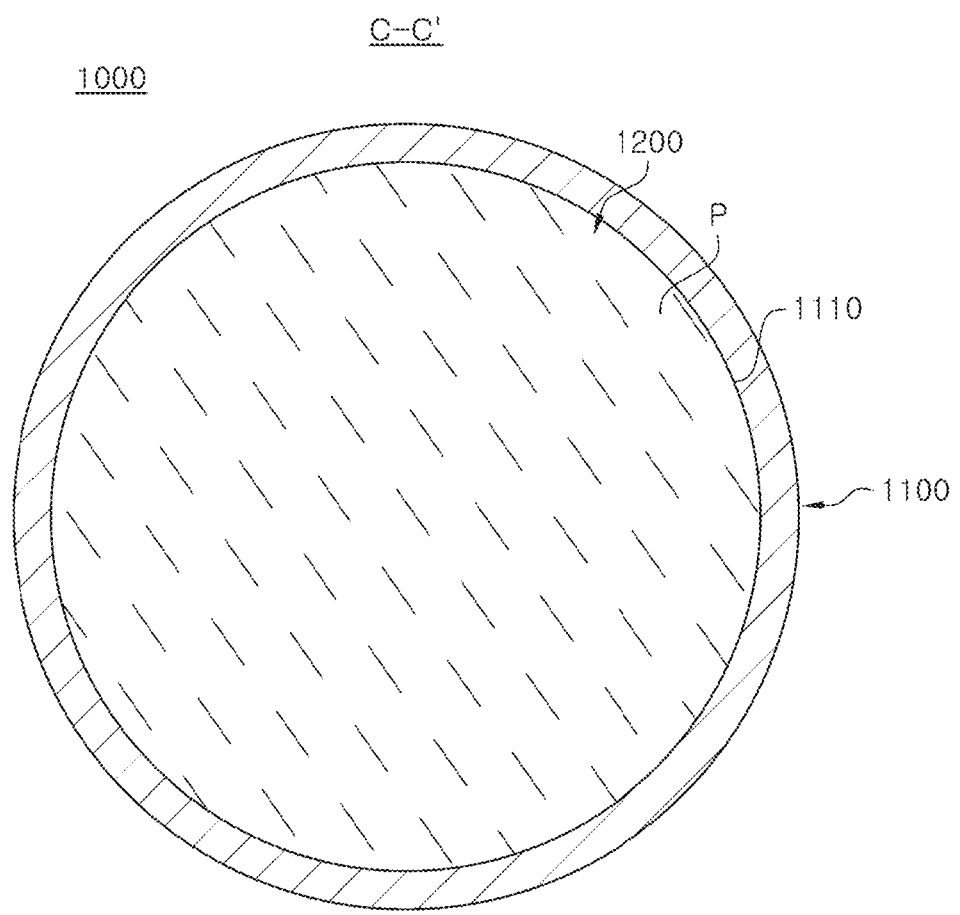
FIG. 5 is a diagram illustrating a first cooling means, viewed in direction C-C' in FIG. 4.
Figure 6:
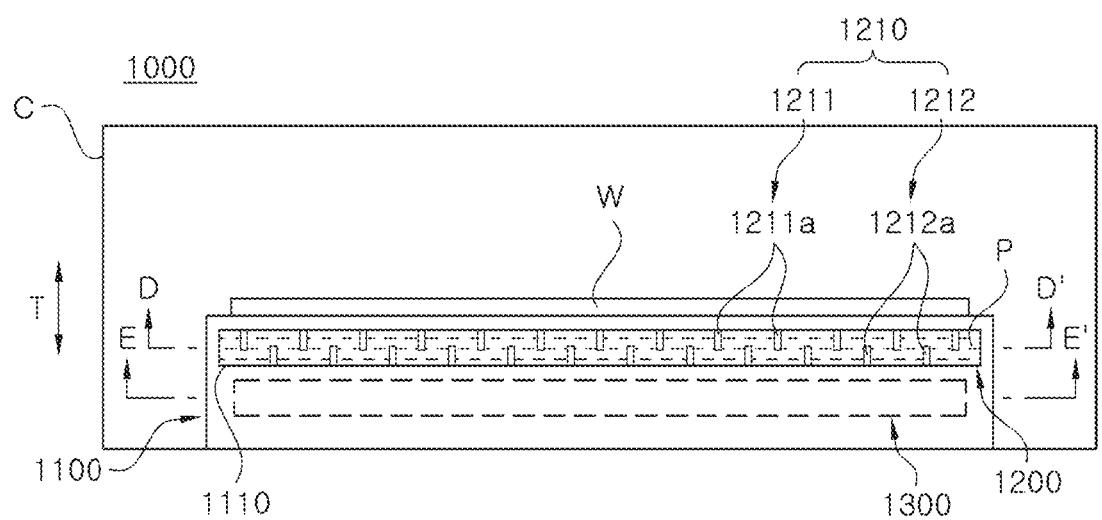
FIG. 6 is a diagram illustrating an apparatus for processing a substrate including a first cooling means and a second cooling means including components of a heat transfer member according to an example embodiment of the present disclosure.
Figure 7:
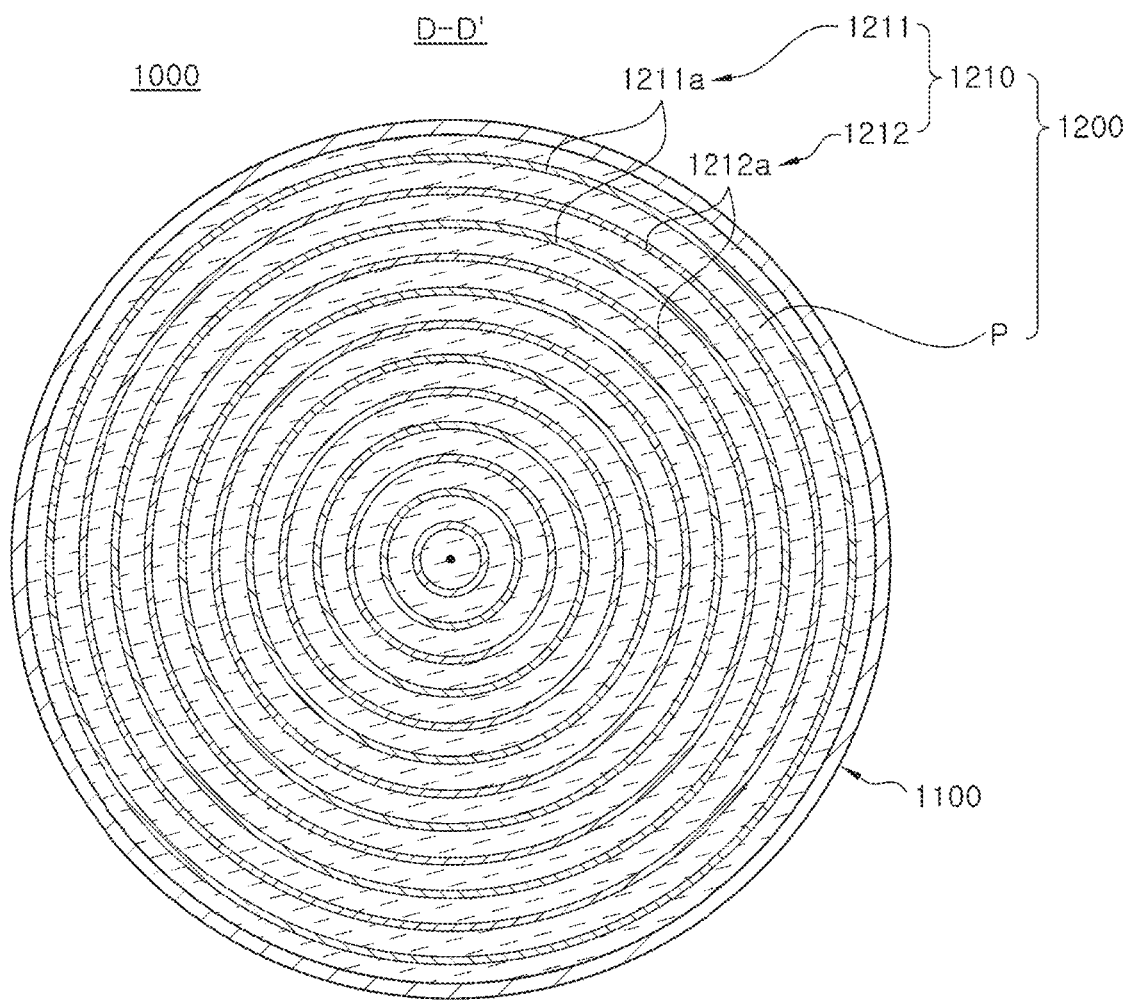
FIG. 7 is a diagram illustrating a first cooling means viewed in direction D-D' in FIG. 6.
Figure 8:
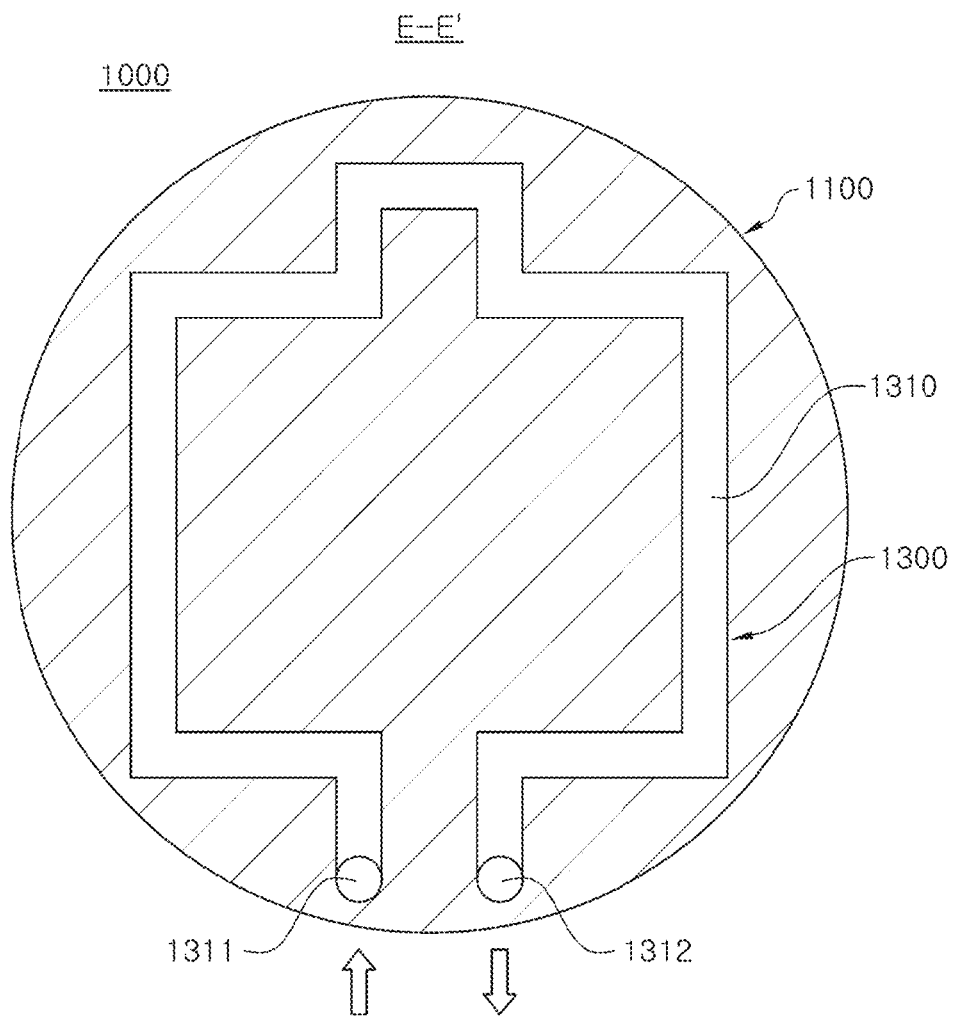
FIG. 8 is a diagram illustrating a second cooling means viewed in E-E' direction in FIG. 6.

FIGS. 4 to 8 are diagrams illustrating the apparatus for processing a substrate according to embodiment 1. FIG. 4 is a diagram illustrating components of an apparatus for processing a substrate according to embodiment 1. FIG. 5 is a diagram illustrating a first cooling means, viewed in a direction C-C' in FIG. 4. FIG. 6 is a diagram illustrating an apparatus for processing a substrate including a first cooling means and a second cooling means including components of a heat transfer member according to an example embodiment. FIG. 7 is a diagram illustrating a first cooling means viewed in a direction D-D' in FIG. 6. FIG. 8 is a diagram illustrating a second cooling means viewed in an E-E' direction in FIG. 6.

Referring to FIGS. 4 and 5, the apparatus 1000 for processing a substrate according to embodiment 1 may be an apparatus for cooling the substrate, and may include a support plate 1100 disposed in the process chamber C, a first cooling means 1200 and a second cooling means 1300. Here, the process chamber C of the apparatus 1000 for processing a substrate may be one of the cooling chamber 340, the baking chamber 510 and the cooling chamber 520 included in the buffer module 300 described above. Here, as an example, when the process chamber C is the baking chamber 510, the support plate 1100 may be applied as a cooling plate 512 within the baking chamber 510.

However, an example embodiment thereof is not limited thereto, and any apparatus for cooling the substrate may be included in the example of the apparatus 1 for processing a substrate.

As illustrated in FIGS. 4 and 5, in the apparatus 1000 for processing a substrate in the embodiment, the support plate 1100 may be configured to support the substrate and may include a first accommodation space 1110 of a disk shape therein. The support plate 1100 may be formed of a material having a high heat transfer rate, but an example embodiment thereof is not limited thereto. For example, the support plate 1100 may be formed of a material such as aluminum.

Here, the disk shape of the first accommodation space 1110 may indicate that the first accommodation space 1110 may form a disk shape when viewed from the upper portion of the support plate 1100. In other words, when viewed from the planar structure of the support plate 1100, the first accommodation space 1110 may have a circular shape.

The first cooling means 1200 may be accommodated in the first accommodation space 1110 of the disk shape of the support plate 1100 and may include a phase change material P.

Here, a phase change material (PCM) P may refer to a material repeatedly exhibiting heat absorption and heat dissipation according to phase change according to external temperature change. In the embodiment, the phase change material may include one of a paraffinic material and a eutectic salt material, and may be accommodated in a manner of being applied into the first accommodation space 1110 of the support plate 1100. The first cooling means 1200 including the phase change material P may cool the substrate W using latent heat energy generated when the phase change material P reaches a predetermined temperature by thermal energy emitted from the substrate W and phase change occurs. Accordingly, even when the substrate W at high temperature is seated on the upper surface of the support plate 1100, the temperature of the support plate P may be maintained to be lower by the phase change material P of the first cooling means 1200 accommodated in the first accommodation space 1110 of the disk shape of the support plate 1100 and the cooling rate of the substrate W may be shortened.

Here, in the first cooling means 1200, the phase change material P accommodated in the first accommodation space 1110 of the disk shape may have a large specific heat capacity and latent heat, but may have low thermal conductivity, and accordingly, the first cooling means 1200 may further include a heat transfer member 1210 to increase thermal conductivity. The heat transfer member 1210 may be disposed on the internal wall surface of the first accommodation space 1110 of the support plate 1100, may be in contact with the phase change material P accommodated in the first accommodation space 1110, and may effectively transfer the thermal energy due to the phase change of the phase change material P to the support plate 1100 and second cooling means 1300. The heat transfer member 1210 may be formed of a material having high thermal conductivity, and is not limited to any particular example. The heat transfer member 1210 may be formed of the same material as that of the support plate 1100. For example, when the support plate 1100 is formed of an aluminum material, the heat transfer member 1210 may also be formed of an aluminum material, but an example embodiment thereof is not limited thereto. As another example, the heat transfer member 1210 may be formed of a material having a high heat transfer rate, such as nickel or titanium. By disposing the components of the heat transfer member 1210, the heat transfer area of the phase change material P may be increased such that heat transfer performance of the first cooling means 1200 may improve.

Referring to FIGS. 6 and 7, the heat transfer member 1210 of the first cooling means 1200 may include a first heat transfer member 1211 and a second heat transfer member 1212.

The first heat transfer member 1211 may be disposed on the upper wall surface of the first accommodation space 1110 of the support plate 1100. Specifically, the first heat transfer member 1211 may include a plurality of first heat transfer pins 1211a spaced apart from each other with a predetermined distance therebetween on the upper wall surface of the first accommodation space 1110. That is, the plurality of first heat transfer pins 1211a may be spaced apart from each other and may protrude downwardly from the upper wall surface of the first accommodation space 1110 of the support plate 1100.

The second heat transfer member 1212 may be disposed on the lower wall surface of the first accommodation space 1110 of the support plate 1100. Specifically, the second heat transfer member 1212 may include a plurality of second heat transfer pins 1212a spaced apart from each other with a predetermined distance therebetween on the lower wall surface of the first accommodation space 1110. That is, the plurality of second heat transfer pins 1212a may be spaced apart from each other and may protrude upwardly from the lower wall surface of the first accommodation space 1110 of the support plate 1100. In this case, the plurality of second heat transfer pins 1212a may be alternately disposed with the plurality of first heat transfer pins 1211a.

The first heat transfer member 1211 of the first cooling means 1200 may mainly transfer heat such that heat exchange may occur between the support plate 1100 and the phase change material P, and the first heat transfer member 1211 transfer the heat transferred from the substrate W to the support plate 1100 to the phase change material P, and the second heat transfer member 1212 of the first cooling means 1200 may mainly transfer heat such that heat exchange occur between the phase change material P and the cooling medium (cooling liquid to be described later) of the second cooling means 1300, and accordingly, the phase change material P may be effectively cooled by the cooling medium of the second cooling means 1300.

Here, the first heat transfer pin 1211a and the second heat transfer pin 1212a may protrude alternately in the thickness direction T of the support plate 1100, and portions of the first heat transfer pin 1211a and the second heat transfer pin 1212a may overlap each other in the thickness direction T. Specifically, the protruding end of the first heat transfer pin 1211a and the protruding end of the second heat transfer pin 1212a may overlap each other in the thickness direction T, such that heat transfer efficiency may be further improved.

In the embodiment, as illustrated in FIG. 7, the plurality of first heat transfer pins 1211a of the first heat transfer member 1211 may be disposed in a concentric shape with respect to a center of the first accommodation space 1110 on an upper wall surface of the first accommodation space 1110 of the support plate 1100. Also, the plurality of second heat transfer pins 1212a of the second heat transfer member 1212 may be disposed in a concentric shape with respect to a center of the first accommodation space 1110 on a lower wall surface of the first accommodation space 1110 of the support plate 1100.

By the configuration of the heat transfer member 1210 including the first heat transfer member 1211 and the second heat transfer member 1212, the heat transfer area of the first cooling means 1200 may be increased and the thickness of the thermal interface layer may be decreased such that heat resistance may be effectively lowered, and accordingly, heat transfer performance of the first cooling means 1200 may be effectively improved.

The second cooling means 1300 may include cooling liquid flowing in the support plate 1100. Here, the cooling liquid may be water, but an example embodiment thereof is not limited thereto. The second cooling means 1300 may be disposed in the support plate 1100 and may be disposed to have at least a portion of the first cooling means 1200 interposed between the second cooling means 1300 and an upper surface of the support plate 1100. For example, the second cooling means 1300 may be disposed in the support plate 1100 and may be disposed to have the entire first cooling means 1200 interposed between the second cooling means 1300 and an upper surface of the support plate 1100. That is, the second cooling means 1300 may be spaced apart from each other below the first accommodation space 1110 in the support plate 1100. Specifically, referring to FIG. 8, the second cooling means 1300 may include a cooling liquid flow path 1310 formed in the support plate 1100 and through which cooling liquid flows. That is, the cooling liquid flow path 1310 of the second cooling means 1300 may be formed directly in the support plate 1100 as a component thereof. Accordingly, the structure of the apparatus 1000 for processing a substrate may be simplified and the apparatus 1000 may be easily manufactured, and since the cooling liquid directly flows through the cooling liquid flow path 1310 formed in the support plate 1100, cooling performance of the support plate 1100 may be improved.

The cooling liquid flow path 1310 may be spaced apart from the lower portion of the first accommodation space 1110 of the support plate 1100, and may include an inlet port 1311 through which cooling liquid flows in on one end and an outlet port 1312 through which cooling liquid flows out on the other end. The inlet port 1311 of the cooling liquid flow path 1310 may be connected to an external cooling liquid supply line, and the outlet port 1312 may be connected to an external cooling liquid discharge line such that cooling liquid may be supplied from the cooling liquid supply line through the inlet port 1311, may flow through the cooling liquid flow path 1310 and may be discharged to the cooling liquid discharge line through the outlet port 1312. Accordingly, the cooling liquid may circulate through the cooling liquid flow path 1310 and may continuously cool the support plate 1100.

The cooling liquid flow path 1310 of the second cooling means 1300 may be implemented in various arrangement structures in the support plate 1100. In the embodiment, as illustrated in FIG. 8, the cooling liquid flow path 1310 of the second cooling means 1300 may be configured to be bent multiple times throughout the entire area of the support plate 1100. Here, the inlet port 1311 and outlet port 1312 of the cooling liquid flow path 1310 may be disposed adjacent to each other. Accordingly, by offsetting the temperature difference between the cooling liquid flowing into the inlet port 1311 of the cooling liquid flow path 1310 and the cooling liquid flowing out of the outlet port 1312 of the cooling liquid flow path 1310, the temperature distribution of the support plate 1100 may be maintained uniformly, such that overall cooling efficiency may be increased.

Also, to increase the uniform cooling effect and cooling performance of the substrate W, the first accommodation space 1110 of the support plate 1100 may have an area covering the entire second cooling means 1300 when viewed from above. That is, the first accommodation space 1110 of the support plate 1100 may have an area covering the entire cooling liquid flow path 1310 of the second cooling means 1300 when viewed from above.

According to the configuration described above, the substrate W supported by the upper surface of the support plate 1100 and the phase change material of the first cooling means 1200 disposed in the first accommodation space 1110 of the support plate 1100 P may be disposed to exchange heat therebetween, and the phase change material P and heat transfer member 1210 of the first cooling means 1200 may be disposed to exchange heat with the cooling liquid of the second cooling means 1300 circulating in the inside of the support plate 1100, such that when the phase change material P of the first cooling means 1200 is heated by the heat transferred from the substrate W on the support plate 1100, the phase change material P of the first cooling means 1200 may be cooled by heat absorption of the cooling liquid of the second cooling means 1300. Accordingly, the phase change material P of the first cooling means 1200 may cause a continuous phase change while being heated by the heat transferred from the substrate W and the support plate 1100, and may effectively cool the substrate W using the latent heat resulting from the phase change from solid to liquid, such that cooling performance of the substrate W may be effectively improved. Also, the phase change material P, which may have undergone a phase change from solid to liquid, may undergo a phase change again by absorption of heat from the cooling liquid of the second cooling means 1300 and may be recovered from a liquid to a solid phase, such that, in the process of cooling the substrate W, the cooling performance of the phase change material P of the first cooling means 1200 may be maintained, and continuous cooling of the substrate W may be implemented. Also, the heat transfer member 1210 of the first cooling means 1200 may expand the heat transfer area of the first cooling means 1200 such that the heat transfer efficiency between the support plate 1100, the phase change material P of the first cooling means 1200 and the cooling liquid of the second cooling means 1300 may effectively improve, and cooling time may be further shortened.

Embodiment 2

Figure 9:
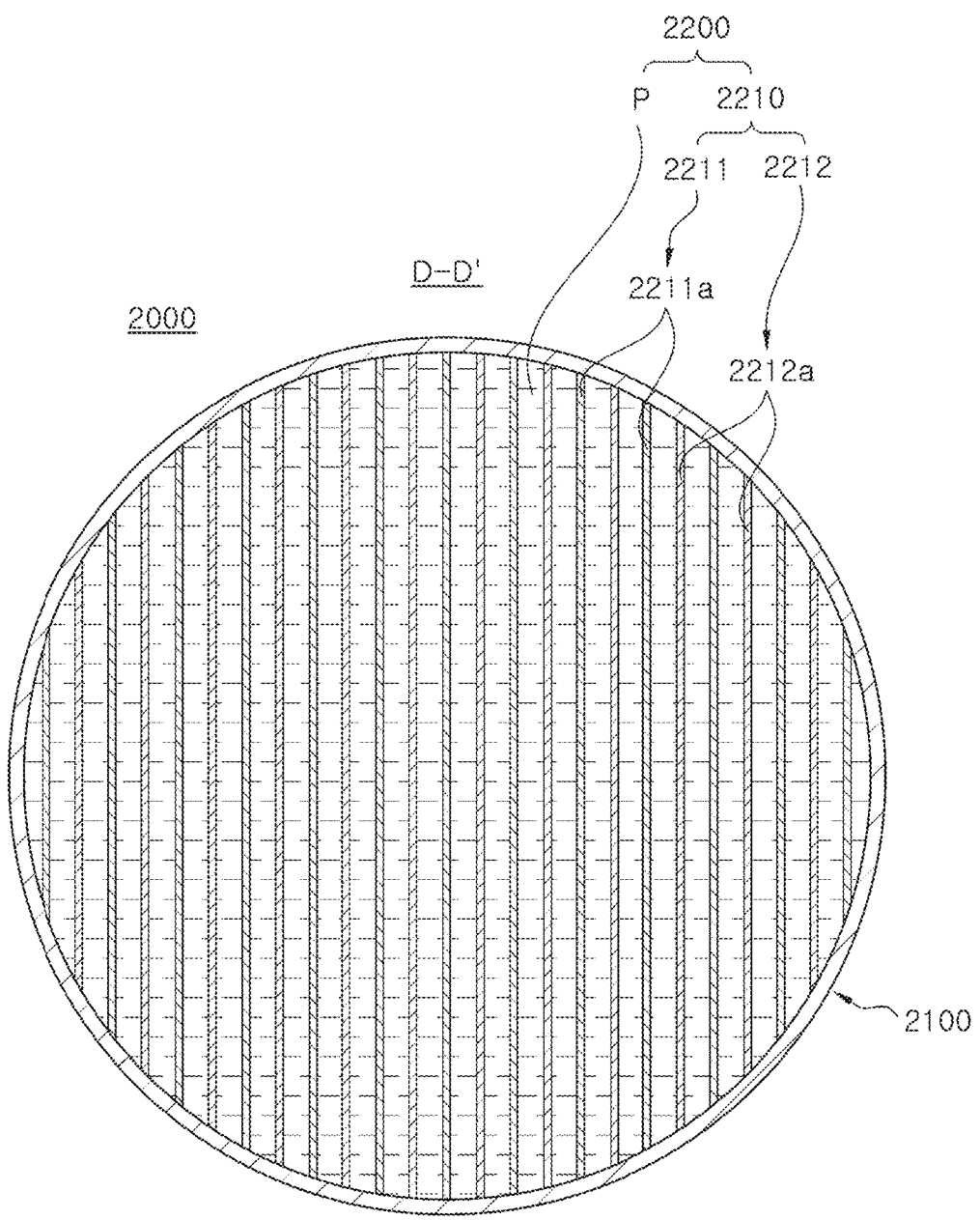
FIG. 9 is a diagram illustrating a first cooling means viewed in direction D-D' in FIG. 6 according to embodiment 2.

FIG. 9 is a diagram illustrating a first cooling means viewed in direction D-D' in FIG. 6 according to embodiment 2.

An apparatus for processing a substrate according to embodiment 2 will be described with reference to FIG. 9.

Referring to FIG. 9, an apparatus 2000 for processing a substrate according to embodiment 2 may include a support plate 2100, a first cooling means 2200 and a second cooling means.

In the embodiment, the components other than the components of the first cooling means 2200 may be the same as the components in the above embodiment 1, and detailed descriptions of the same components will not be provided to avoid overlapping.

Referring to FIG. 9, the heat transfer member 2210 of the first cooling means 2200 may include a first heat transfer member 2211 and a second heat transfer member 2212.

The first heat transfer member 2211 may be disposed on the upper wall surface of the first accommodation space 2110 of the support plate 2100. Specifically, the first heat transfer member 2211 may include a plurality of first heat transfer pins 2211a spaced apart from each other with a predetermined distance therebetween on the upper wall surface of the first accommodation space 2110.

The second heat transfer member 2212 may be disposed on the lower wall surface of the first accommodation space 2110 of the support plate 2100. Specifically, the second heat transfer member 2212 may include a plurality of second heat transfer pins 2212a spaced apart from with a predetermined distance therebetween on the lower wall surface of the first accommodation space 2110. In this case, the plurality of second heat transfer pins 2212a may be alternately disposed with the plurality of first heat transfer pins 2211a.

Here, the first heat transfer pin 2211a and the second heat transfer pin 2212a may protrude alternately in the thickness direction T of the support plate 2100, and portions of the first heat transfer pin 2211a and the second heat transfer pin 2212a may overlap each other in the thickness direction T. Specifically, the protruding end of the first heat transfer pin 2211a and the protruding end of the second heat transfer pin 2212a may overlap each other in the thickness direction T, such that heat transfer efficiency may be further improved.

In the embodiment, referring to FIG. 9, the plurality of first heat transfer pins 2211a of the first heat transfer member 2211 may extend parallel to each other in one direction on the upper wall surface of the first accommodation space 2110. Also, the plurality of second heat transfer pins 2212a of the second heat transfer member 2212 may extend parallel to the plurality of first heat transfer pins 2211a on the lower wall surface of the first accommodation space 2110.

By the configuration of the heat transfer member 2210 including the first heat transfer member 2211 and the second heat transfer member 2212, the heat transfer area of the first cooling means 2200 may be increased and the thickness of the thermal interface layer may be reduced, such that heat resistance may be effectively lowered, such that heat transfer performance of the first cooling means 2200 may be effectively improved.

Embodiment 3

Figure 10:
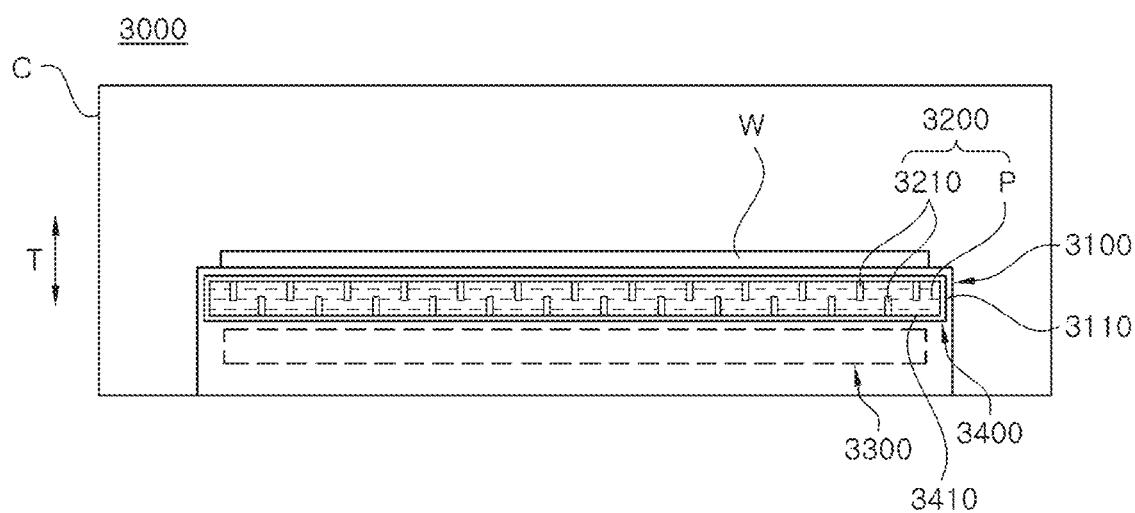
FIG. 10 is a diagram illustrating components of an apparatus for processing a substrate according to embodiment 3.

FIG. 10 is a diagram illustrating components of an apparatus for processing a substrate according to embodiment 3.

An apparatus for processing a substrate according to embodiment 3 will be described with reference to FIG. 10.

Referring to FIG. 10, an apparatus for processing a substrate 3000 according to embodiment 3 may include a support plate 3100, a first cooling means 3200 and a second cooling means 3300.

In the embodiment, components other than the components of the support plate 3100 may be the same as the components of embodiments 1 and 2 above, and detailed descriptions of the same components will not be provided to avoid overlapping.

In the embodiment, the support plate 3100 may not directly from a first accommodation space therein, and the first cooling means 3200 may be accommodated in the first accommodation space 3410 formed through a different component.

Specifically, referring to FIG. 10, the support plate 3100 may further include a housing 3400 included in a first accommodation space 3410 therein.

In this case, an arrangement space 3110 accommodating the housing 3400 may be formed in the support plate 3100.

The first cooling means 3200 may be disposed in the first accommodation space 3410 of the housing 3400. That is, the phase change material P of the first cooling means 3200 may be accommodated in the first accommodation space 3410 of the housing 3400, and the heat transfer member 3210 of the first accommodation space 3410 of the housing 3400 may be disposed on internal wall surfaces. The configuration of the first accommodation space 3410 of the housing 3400 may be the same as the configuration of the first accommodation space of embodiments 1 to 2 above, and a detailed description thereof will not be provided.

The housing 3400 may be formed of the same material as that of the heat transfer member 3210 of the support plate 3100 or the first cooling means 3200, but an example embodiment thereof is not limited thereto, and various materials may be used as long as the heat transfer rate is high.

Accordingly, by disposing the housing 3400 having the first accommodation space 3410 in which the first cooling means 3200 is accommodated in the arrangement space 3110 of the support plate 3100, the design precision of the apparatus 3000 for processing a substrate may improve, and deformation due to the influence of thermal energy of the support plate 3100 may be effectively prevented, such that durability may be improved.

In the embodiment, the support plate may include a housing, but an example embodiment thereof is not limited thereto, and the housing may be implemented to be included in the first cooling means. That is, the first cooling means may be manufactured separately from the support plate, and may be implemented as an embodiment comprising a housing and a phase change material and a heat transfer member accommodated in the housing, which is also included in the scope of the present disclosure.

Embodiment 4

Figure 11:
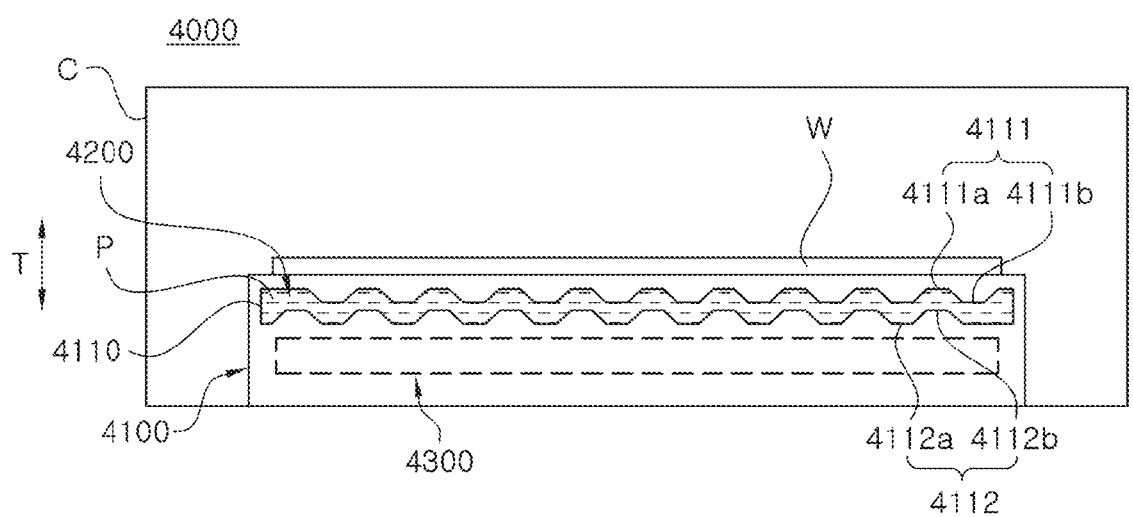
FIG. 11 is a diagram illustrating components of an apparatus for processing a substrate according to embodiment 4.

FIG. 11 is a diagram illustrating components of an apparatus for processing a substrate according to embodiment 4.

An apparatus for processing a substrate according to embodiment 4 will be described with reference to FIG. 11.

Referring to FIG. 11, an apparatus 4000 for processing a substrate according to embodiment 4 may include a support plate 4100, a first cooling means 4200 and a second cooling means 4300.

In the embodiment, components other than the components of the first accommodation space 4110 of the support plate 4100 may be the same as the components of embodiments 1 to 3 described above, and detailed descriptions of the same components will not be provided to avoid overlapping.

A plurality of grooves 4111a and 4112a may be alternately disposed on an upper wall surface 4111 and a lower wall surface 4112 of the first accommodation space 4110 of the support plate 4100 to form a meandering shape, instead of the component of the heat transfer member 1210 of the first cooling means 1200 of embodiment 1. Here, the lowermost end surface 4111b of the upper wall surface 4111 of the first accommodation space 4110 may be alternately disposed with the uppermost end surface 4112b of the lower wall surface 4112 of the first accommodation space 4110 and may be disposed in a linear line. In another embodiment, the lowermost end surface of the upper wall surface of the first accommodation space may be alternately disposed with the uppermost end surface of the lower wall surface of the first accommodation space, and the lowermost end surface of the upper wall surface of the first accommodation space may be disposed below the uppermost end surface of the lower wall surface of the first accommodation space in the thickness direction of the support plate. According to this configuration, the heat transfer area of the phase change material P of the first cooling means 4200 accommodated in the meandering first accommodation space 4110 may be enlarged and the thickness of the thermal interface layer may be reduced such that thermal resistance may be effectively lowered. Accordingly, heat transfer performance of the first cooling means 4200 may be effectively improved.

Embodiment 5

Figure 12A:
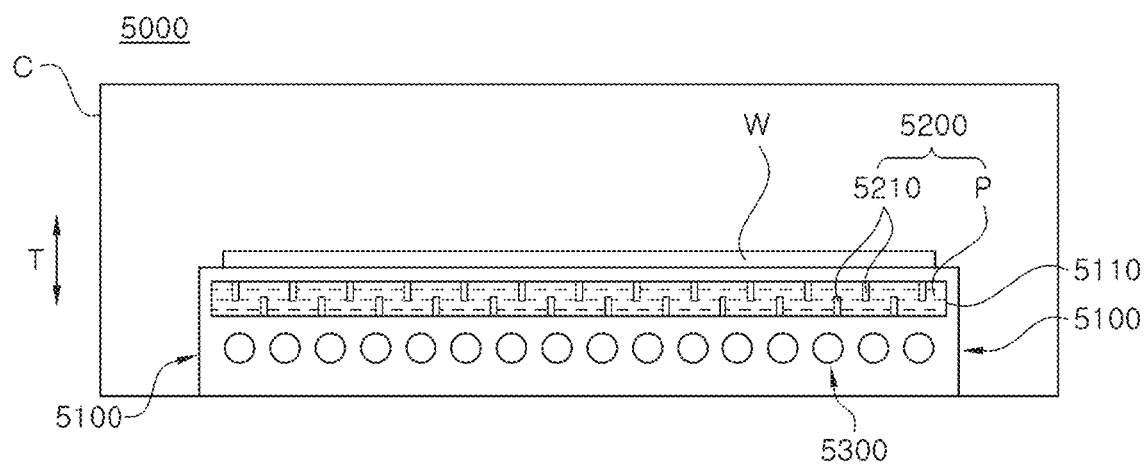
FIG. 12A is a diagram illustrating components of an apparatus for processing a substrate according to embodiment 5.
Figure 12B:
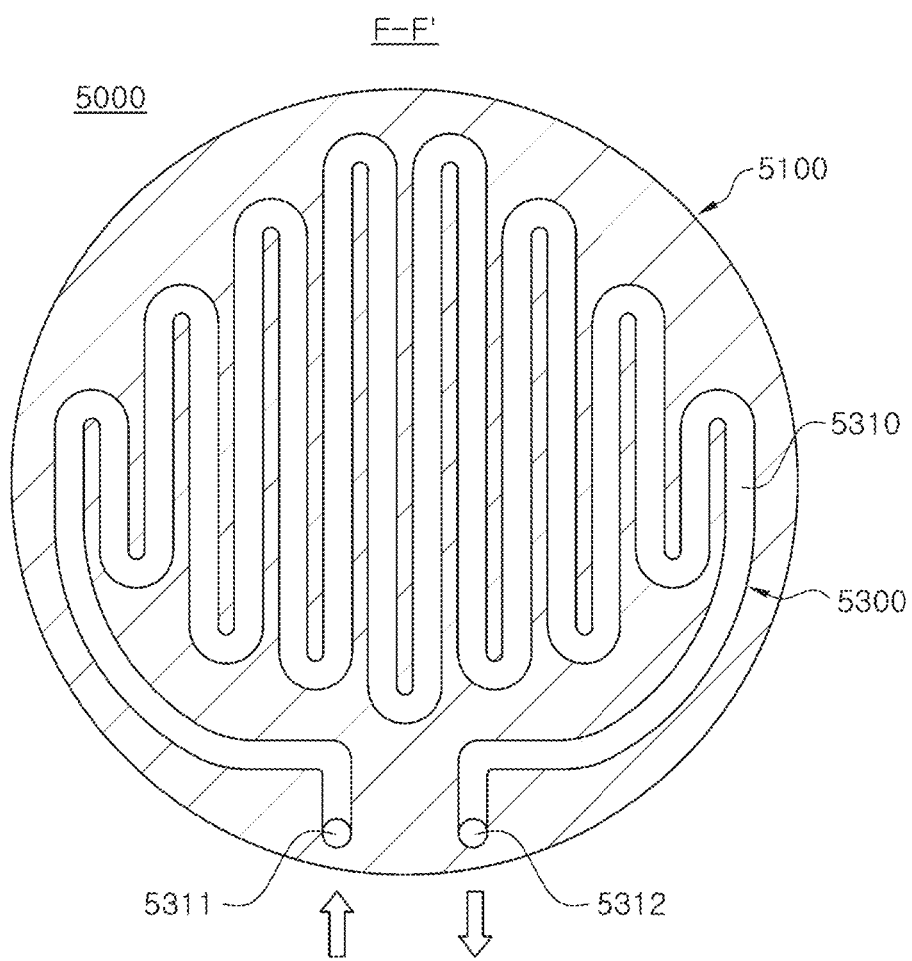
FIG. 12B is a diagram illustrating a second cooling means viewed in direction F-F' in FIG. 12A.

FIG. 12A is a diagram illustrating components of an apparatus for processing a substrate according to embodiment 5. FIG. 12B is a diagram illustrating a second cooling means viewed in direction F-F' in FIG. 12A.

An apparatus for processing a substrate according to embodiment 5 will be described with reference to FIGS. 12A and 12B.

Referring to FIGS. 12A and 12B, an apparatus 5000 for processing a substrate according to embodiment 5 may include a support plate 5100, a first cooling means 5200 and a second cooling means 5300.

In the embodiment, the components other than the components of the first accommodation space 5110 and the second cooling means 5300 of the support plate 5100 may be the same as the components of embodiments 1 to 4 above, and detailed descriptions of the same components will not be provided to avoid overlapping.

The first cooling means 5200 may include, for example, a heat transfer member 5210 and a phase change material P in the first accommodation space 5110 as in embodiment 1.

The second cooling means 5300 may be disposed in the support plate 5100 and may be disposed to have the entire first cooling means 5200 interposed between the second cooling means 5300 and an upper surface of the support plate 5100. That is, the second cooling means 5300 may be spaced apart from each other below the first accommodation space 5110 in the support plate 5100. The second cooling means 5300 may include a cooling liquid flow path 5310 formed in the support plate 5100 and through which cooling liquid flows.

The cooling liquid flow path 5310 may be spaced apart from the lower portion of the first accommodation space 5110 of the support plate 5100, and may include an inlet port 5311 through which cooling liquid flows in on one end and an outlet port 5312 through which cooling liquid flows out on the other end. The inlet port 5311 of the cooling liquid flow path 5310 may be connected to an external cooling liquid supply line, and the outlet port 5312 may be connected to an external cooling liquid discharge line such that the cooling liquid may be supplied from the cooling liquid supply line through the inlet port 5311, may flow through the cooling liquid flow path 5310, and may be discharged to the cooling liquid discharge line through the outlet port 5312, and accordingly, the cooling liquid may circulate through the cooling liquid flow path 5310 and may continuously cool the support plate 5100.

The cooling liquid flow path 5310 of the second cooling means 5300 may be implemented in various arrangement structures in the support plate 5100. In the embodiment, as illustrated in FIGS. 12A and 12B, the cooling liquid flow path 5310 of the second cooling means 5300 may extend in a zigzag pattern in one direction in the support plate 5100, and an inlet port 5311 and an outlet port 5312 of the cooling liquid flow path 5310 may be disposed adjacent to each other. Accordingly, the temperature difference between the cooling liquid flowing into the inlet port 5311 of the cooling liquid flow path 5310 and the cooling liquid flowing out through the outlet port 5312 of the cooling liquid flow path 5310 may be significantly offset, such that the temperature distribution of the support plate 5100 may be maintained uniformly, and overall cooling efficiency may be increased.

Also, to increase the uniform cooling effect and cooling performance of the substrate W, the first accommodation space 5110 of the support plate 5100 may have an area covering the entirety of the second cooling means 5300 when viewed from above. That is, the first accommodation space 5110 of the support plate 5100 may have an area covering the entire cooling liquid flow path 5310 of the second cooling means 5300 when viewed from above.

Here, the cooling liquid flow path of the second cooling means may extend in a zigzag pattern, but an example embodiment thereof is not limited thereto, and may be bent more than once over the entire area of the support plate and may be disposed in a spiral shape.

Embodiment 6

Figure 13:
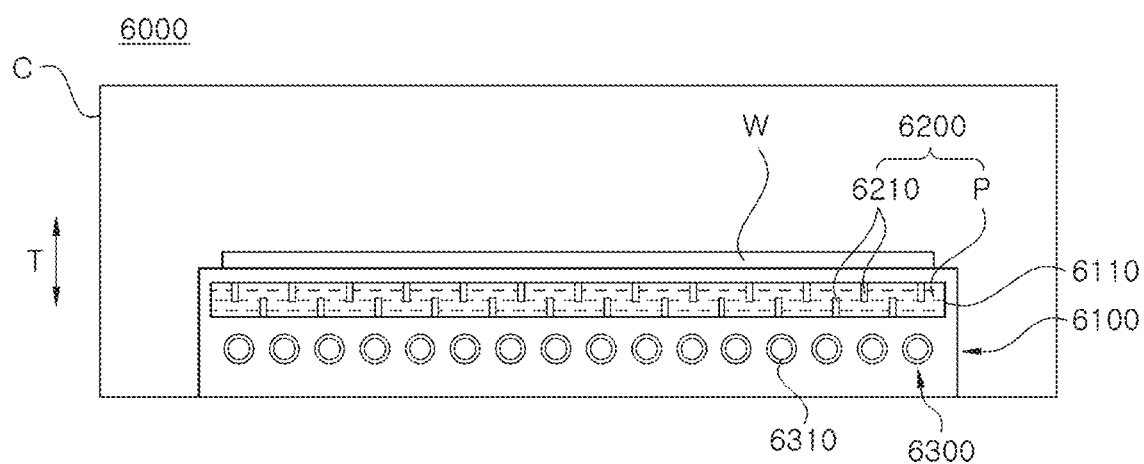
FIG. 13 is a diagram illustrating components of an apparatus for processing a substrate according to embodiment 6.

FIG. 13 is a diagram illustrating components of an apparatus for processing a substrate according to embodiment 6.

An apparatus for processing a substrate according to embodiment 6 will be described with reference to FIG. 13.

Referring to FIG. 13, an apparatus for processing a substrate 6000 according to embodiment 6 may include a support plate 6100, a first cooling means 6200 and a second cooling means 6300.

In the embodiment, the components other than the components of the support plate 6100 and the second cooling means 6300 may be the same as the components of the above embodiments 1 to 5, and detailed descriptions of the same components will not be provided to avoid overlapping.

The first cooling means 6200 may include, for example, a heat transfer member 6210 and a phase change material P in the first accommodation space 6110 as in embodiment 1.

The support plate 6100 may replace the cooling liquid flow path 1310 of embodiment 1 and may further include a second accommodation space 6120 spaced apart from the first accommodation space 6110.

In this case, the second cooling means 6300 may be disposed in the second accommodation space 6120 of the support plate 6100 and may include a cooling liquid pipe 6310 through which cooling liquid flows. That is, the cooling liquid pipe 6310 may be disposed in the second accommodation space 6120 of the support plate 6100 and may be disposed to have the entire first cooling means 6200 interposed between the cooling liquid pipe 6310 and an upper surface of the support plate 6100. Here, the second accommodation space 6120 of the support plate 6100 may be configured in a form corresponding to that of the cooling liquid pipe 6310 of the second cooling means 6300. The cooling liquid pipe 6310 may have an inlet port (not illustrated) through which cooling liquid flows in on one end and an outlet port (not illustrated) through which cooling liquid flows out on the other end. The inlet port of the cooling liquid pipe 6310 may be connected to an external cooling liquid supply line, and the outlet port may be connected to an external cooling liquid discharge line such that cooling liquid may be supplied from the cooling liquid supply line through the inlet port to the cooling liquid pipe 6310, may flow through the cooling liquid pipe 6310, and may be discharged through the outlet port to the cooling liquid discharge line, and accordingly, the cooling liquid may circulate through the cooling liquid pipe 6310 and may continuously cool the support plate 6100.

Also, to realize a uniform cooling effect and improved cooling performance for the substrate W, the first accommodation space 6110 of the support plate 6100 may have an area covering the entire second cooling means 6300 when viewed from above. That is, the first accommodation space 6110 of the support plate 6100 may have an area covering the entire cooling liquid pipe 6310 of the second cooling means 6300 when viewed from above.

The cooling liquid pipe 6310 of the second cooling means 6300 may be implemented in various arrangement structures. As for the arrangement structure of the cooling liquid pipe 6310 of the second cooling means 6300 of the embodiment, the curved arrangement structure of the cooling liquid flow path 1310 of the second cooling means 1300 of embodiment 1 and the zigzag arrangement structure of the cooling liquid flow path 5310 of the second cooling means 5300 of embodiment 5 may be applied, but an example embodiment thereof is not limited thereto, and the arrangement structure may be configured in various forms.

Embodiment 7

Figure 14:
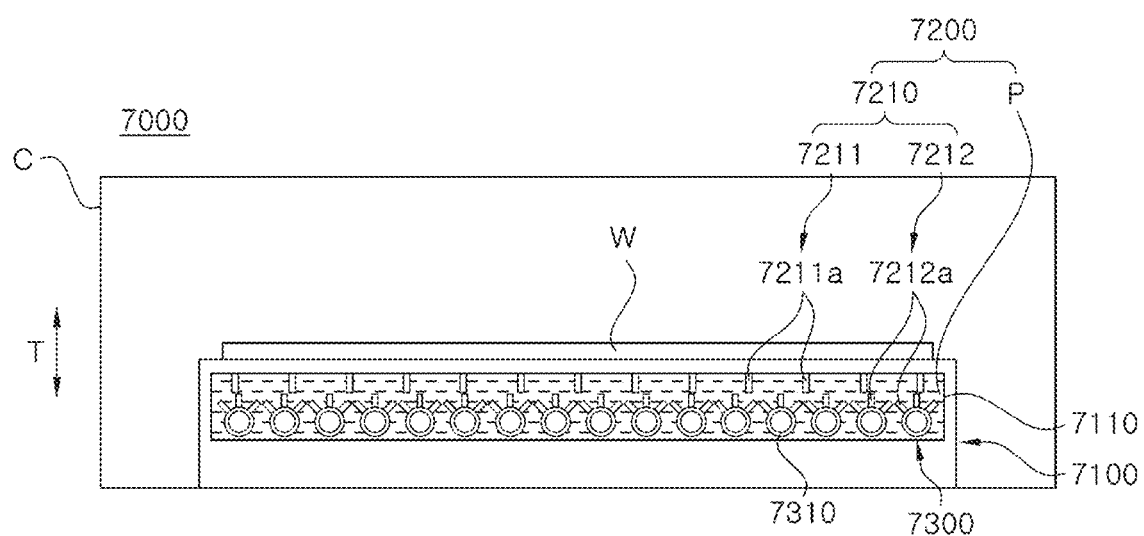
FIG. 14 is a diagram illustrating components of an apparatus for processing a substrate according to embodiment 7.

FIG. 14 is a diagram illustrating components of an apparatus for processing a substrate according to embodiment 7.

An apparatus for processing a substrate according to embodiment 7 will be described with reference to FIG. 14.

Referring to FIG. 14, an apparatus for processing a substrate 7000 according to embodiment 7 may include a support plate 7100, first cooling means 7200 and second cooling means 7300.

The support plate 7100 may include a first accommodation space 7110 having a disk shape therein. In this case, both the first cooling means 7200 and the second cooling means 7300 may be disposed in the first accommodation space 7110.

Specifically, the first cooling means 7200 may include a phase change material P accommodated in the first accommodation space 7110 and a heat transfer member 7210 disposed in the first accommodation space 7110 and the second cooling means 7300. In this case, the second cooling means 7300 may include a cooling liquid pipe 7310 through which cooling liquid flows.

The cooling liquid pipe 7310 of the second cooling means 7300 may include an inlet port (not illustrated) through which the cooling liquid flows and an outlet port (not illustrated) through which the cooling liquid flows out, the inlet port and the outlet port disposed on the lower surface of the first accommodation space 7110 of the support plate 7100. The inlet port and outlet port may be disposed adjacent to each other. The configuration of the cooling liquid pipe 7310 of the second cooling means 7300 may be the same as the configuration of the cooling liquid pipe 6310 through which the cooling liquid flows, as described in embodiment 6 above, and a description thereof will not be provided.

The phase change material P of the first cooling means 7200 may be in contact with the external wall surface of the cooling liquid pipe 7310 of the second cooling means 7300 in the first accommodation space 7110 of the support plate 7100. The heat transfer member 7210 may include a first heat transfer member 7211 disposed on the upper wall surface of the first accommodation space 7110 of the support plate 7100 and a second heat transfer member 7212 disposed on the external wall surface of the cooling liquid pipe 7310 of the second cooling means 7300. The first heat transfer member 7211 may include a plurality of first heat transfer pins 7211a protruding from the upper wall surface of the first accommodation space 7110 of the support plate 7100 to be spaced apart from each other toward the cooling liquid pipe 7310 of the second cooling means 7300. The second heat transfer member 7212 may include a plurality of second heat transfer pins 7212a protruding and spaced apart from each other on the external wall surface of the cooling liquid pipe 7310 of the second cooling means 7300 in the circumferential direction.

By including the configuration of the apparatus for processing a substrate 7000 having a structure in which the first cooling means 7200 and the second cooling means 7300 are disposed in the first accommodation space 7110 of the support plate 7100, the entire heat transfer area of the apparatus 7000 for processing a substrate may be enlarged and cooling performance may be effectively improved.

Embodiment 8

Figure 15:
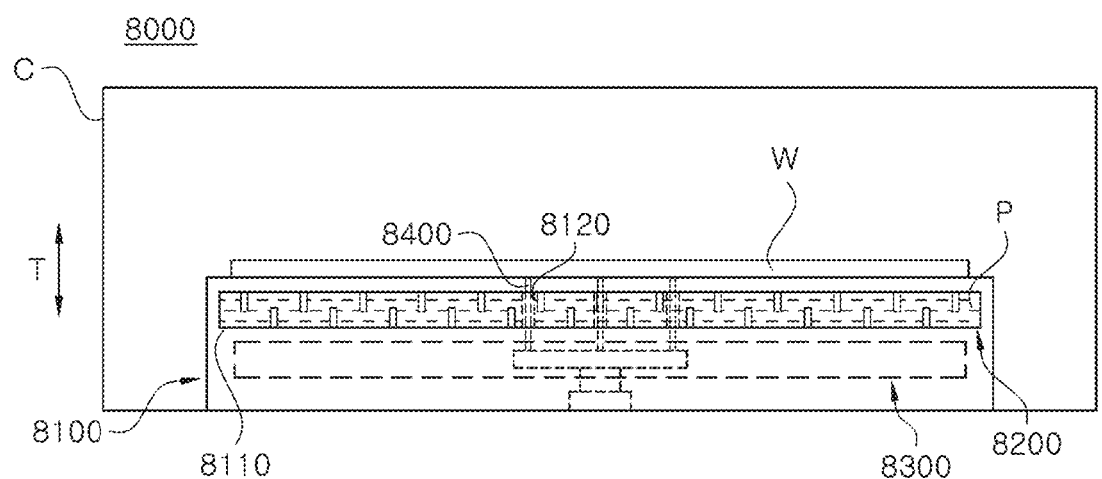
FIG. 15 is a diagram illustrating components of an apparatus for processing a substrate according to embodiment 8.

FIG. 15 is a diagram illustrating components of an apparatus for processing a substrate according to embodiment 8.

An apparatus for processing a substrate according to embodiment 8 will be described with reference to FIG. 15.

Referring to FIG. 15, an apparatus for processing a substrate 8000 according to embodiment 8 may include a support plate 8100, a first cooling means 8200, a second cooling means 8300 and a support pin 8400.

The support plate 8100 may have a first accommodation space 8110 having a disk shape disposed therein and may support the substrate W.

The first cooling means 8200 may be accommodated in the first accommodation space 8110 of the support plate 8100 and may include a phase change material.

The second cooling means 8300 may be disposed in the support plate 8100 and may be disposed to have the first cooling means 8200 interposed between the second cooling means 8300 and an upper surface of the support plate 8100, and may cool the support plate 8100.

In the embodiment, the components other than the components additionally including the support pin 8400 may be the same as in embodiments 1 to 7 above, and detailed descriptions of the same components will not be provided to avoid overlapping.

The support pin 8400 may be disposed to be partitioned from the first accommodation space 8110 in the support plate 8100, may penetrate the upper surface of the support plate 8100 and may support the substrate W to move up and down.

Specifically, a support pin penetration hole 8120 through which the support pin 8400 passes may be disposed in the support plate 8100. In this case, the first accommodation space 8110 of the support plate 8100 may be configured to have a disc shape as an alternative chuck by avoiding the position of the support pin penetration hole 8120.

Accordingly, according to the configuration of the above embodiments, the substrate supported on the upper surface of the support plate and the phase change material of the first cooling means disposed in the first accommodation space of the support plate may be disposed such that heat may be exchanged therebetween, and the phase change material and the heat transfer member of the first cooling means may be disposed to exchange heat with the cooling liquid of the second cooling means circulating in the support plate, such that, when the phase change material of the first cooling means is heated by the heat transferred from the substrate on the support plate, the phase change material of the first cooling means may be cooled by the heat absorption of the cooling liquid of the second cooling means. Accordingly, the phase change material of the first cooling means may cause a continuous phase change while being heated by the heat transferred from the substrate and support plate, and may effectively cool the substrate using the latent heat from the phase change from solid to liquid, and accordingly, cooling performance of the substrate may be effectively improved. Also, the phase change material, which may have undergone phase change from solid to liquid, may undergo phase change again by the absorption of heat by the cooling liquid of the second cooling means and may be recovered from the liquid to the solid phase. Accordingly, cooling performance of the phase change material of the first cooling means may be implemented such that continuous cooling of the substrate W may be implemented. Also, since the heat transfer member of the first cooling means may effectively improve the heat transfer efficiency between the support plate, the phase change material of the first cooling means and the cooling liquid of the second cooling means by expanding the heat transfer area of the first cooling means, the cooling time may be further shortened.

While the example embodiments have been illustrated and described above, it will be apparent to those skilled in the art that modifications and variations could be made without departing from the scope of the present disclosure as defined by the appended claims.

What is claimed is:

1. An apparatus for processing a substrate, the apparatus comprising:
    a support plate including a first accommodation space having a disk shape disposed therein and supporting a substrate;
    a first cooling means accommodated in the first accommodation space and including a phase change material; and
    a second cooling means disposed in the support plate and disposed to have at least a portion of the first cooling means interposed between the second cooling means and an upper surface of the support plate, and including cooling liquid flowing in the support plate,
    wherein the first cooling means includes a heat transfer member disposed on an internal wall surface of the first accommodation space and in contact with the phase change material, and
    wherein the heat transfer member includes a first heat transfer member disposed on an upper wall surface of the first accommodation space and a second heat transfer member disposed on a lower wall surface of the first accommodation space.

2. The apparatus of claim 1,
    wherein the second cooling means is spaced apart from a lower portion of the first accommodation space in the support plate.

3. The apparatus of claim 2,
    wherein the first heat transfer member includes a plurality of first heat transfer pins spaced apart from each other in a predetermined distance therebetween on an upper wall surface of the first accommodation space; and
    wherein the second heat transfer member includes a plurality of second heat transfer pins spaced apart from each other on a lower wall surface of the first accommodation space with a predetermined distance therebetween and alternately disposed with the first heat transfer pins.

4. The apparatus of claim 3,
    wherein the plurality of first heat transfer pins are spaced apart from each other on an upper wall surface of the first accommodation space in a concentric shape with respect to a center of the first accommodation space, and
    wherein the plurality of second heat transfer pins are spaced apart from each other on a lower wall surface of the first accommodation space in a concentric shape with respect to a center of the first accommodation space to be alternately disposed with the plurality of first heat transfer pins.

5. The apparatus of claim 3,
    wherein the plurality of first heat transfer pins extend in parallel to each other in one direction on an upper wall surface of the first accommodation space, and
    wherein the plurality of second heat transfer pins extend in parallel to the plurality of first heat transfer pins on a lower wall surface of the first accommodation space.

6. The apparatus of claim 3, wherein the first heat transfer pin and the second heat transfer pin protrude alternately with each other in a thickness direction of the support plate, and the first heat transfer pin and the second heat transfer pin have portions overlapping each other in the thickness direction.

7. The apparatus of claim 6, wherein a protruding end of the first heat transfer pin and a protruding end of the second heat transfer pin overlap each other in the thickness direction.

8. The apparatus of claim 2,
    wherein the second cooling means includes a cooling liquid pipe disposed on a lower surface of the first accommodation space and including an inlet port through which the cooling liquid flows in and an outlet port through which the cooling liquid flows out to allow the cooling liquid flows therethrough, and
    wherein the phase change material is in contact with an external wall surface of the cooling liquid pipe in the first accommodation space, and the heat transfer member is disposed on an upper wall surface of the first accommodation space and an external wall surface of the cooling liquid pipe.

9. The apparatus of claim 1, wherein the first accommodation space has an area entirely covering the second cooling means when viewed from above.

10. The apparatus of claim 1, wherein the phase change material includes one of a paraffinic material and a eutectic salt material.

11. The apparatus of claim 1, wherein the support plate includes a housing forming the first accommodation space therein.

12. The apparatus of claim 1, wherein the second cooling means includes a cooling liquid flow path spaced apart from a lower portion of the first accommodation space in the support plate, and including an inlet port into which the cooling liquid flows and an outlet port through which the cooling liquid flows out to allow the cooling liquid flows therethrough.

13. The apparatus of claim 1,
wherein the support plate includes a second accommodation space spaced apart from a lower portion of the first accommodation space, and
wherein the second cooling means includes a cooling liquid pipe disposed in the second accommodation space and including an inlet port through which the cooling liquid flows in and an outlet port through which the cooling liquid flows out to allow the cooling liquid flows therethrough, and the inlet port and the outlet port are disposed adjacent to each other.

14. An apparatus for processing a substrate, the apparatus comprising:
a support plate including a first accommodation space having a disk shape disposed therein and supporting a substrate;
a support pin disposed in the support plate to be partitioned from the first accommodation space, penetrating an upper surface of the support plate, and supporting the substrate to move up and down;
a first cooling means accommodated in the first accommodation space and including a phase change material; and
a second cooling means disposed in the support plate and disposed to have the first cooling means interposed between the second cooling means and an upper surface of the support plate, and cooling the support plate.

15. An apparatus for processing a substrate, the apparatus comprising:
a process chamber in which the substrate is accommodated;
a support plate disposed in the process chamber, including a first accommodation space having a disk shape and a cooling liquid flow path disposed vertically and spaced apart from each other therein, and supporting a substrate;
a first cooling means including a phase change material accommodated in the first accommodation space, a plurality of first heat transfer pins in contact with the phase change material and spaced apart from each other and protruding downwardly from an upper wall surface of the first accommodation space, and a plurality of second heat transfer pins spaced apart from each other and protruding upwardly from a lower wall surface of the first accommodation space and disposed alternately with the first heat transfer pins; member; and
a second cooling means including cooling liquid accommodated in the cooling liquid flow path and flowing through the cooling liquid flow path.

16. The apparatus of claim 15, wherein the first accommodation space has an area entirely covering the cooling liquid flow path when viewed from above.

17. The apparatus of claim 15, wherein the first heat transfer pin and the second heat transfer pin protrude alternately from each other in a thickness direction of the support plate, and a protruding end of the first heat transfer pin and a protruding end of the second heat transfer pin overlap each other in the thickness direction.

18. The apparatus of claim 17,
wherein the plurality of first heat transfer pins are spaced apart from each other on an upper wall surface of the first accommodation space in a concentric shape with respect to a center of the first accommodation space, and
wherein the plurality of second heat transfer pins are spaced apart from each other on a lower wall surface of the first accommodation space in a concentric shape with respect to a center of the first accommodation space to be alternately disposed with the first heat transfer pins.

19. The apparatus of claim 15, wherein the phase change material includes one of a paraffinic material and a eutectic salt material.

* * * * *